US008618833B1

(12) United States Patent
Bergkvist, Jr. et al.

(10) Patent No.: US 8,618,833 B1
(45) Date of Patent: Dec. 31, 2013

(54) SOURCE SERIES TERMINATED DRIVER CIRCUIT WITH PROGRAMMABLE OUTPUT RESISTANCE, AMPLITUDE REDUCTION, AND EQUALIZATION

(75) Inventors: John J. Bergkvist, Jr., Williston, VT (US); Carrie E. Cox, Apex, NC (US); Todd E. Leonard, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/526,725

(22) Filed: Jun. 19, 2012

(51) Int. Cl.
*H03K 19/0175* (2006.01)

(52) U.S. Cl.
USPC .................................. 326/30; 326/83; 326/87

(58) Field of Classification Search
USPC ............................................... 326/30, 82–87
See application file for complete search history.

(56) References Cited

U.S. PATENT DOCUMENTS

| 5,107,230 | A | * | 4/1992 | King ................................ 326/86 |
| 6,930,506 | B2 | | 8/2005 | Cranford, Jr. et al. |
| 7,307,447 | B2 | | 12/2007 | Clements et al. |
| 7,368,902 | B2 | | 5/2008 | Clements et al. |

* cited by examiner

*Primary Examiner* — Jany Richardson
(74) *Attorney, Agent, or Firm* — H. Barrett Spraggins; H. Daniel Schnurmann; Biggers Kennedy Lenart Spraggins LLP

(57) ABSTRACT

A source-series terminated ('SST') driver circuit that includes: one or more data signal inputs; one or more control signal inputs; a driver output; and a plurality of driver cells, the driver cells coupled in parallel to one another, outputs of the driver cells coupled together to form the driver output of the SST driver circuit, where output resistance of the SST driver circuit varies in dependence upon activation of one or more of the parallel driver cells, activation of each driver cell controlled by control signals received at the control signal inputs.

15 Claims, 6 Drawing Sheets

Program, By An SST Driver Circuit Controller, The SST Driver Circuit To Effect A Target Output Resistance 302

Program The SST Driver Circuit Controller To Effect A Target Amplitude Reduction And A Target Equalization Of Data Signals Transmitted By The SST Driver Circuit 602

Calculate, For The Target Amplitude Reduction Of Data Signals, A Number Of Activated Parallel Driver Cells Of A First Set To Source The Complement Data Signal 604

Calculate, For The Target Equalization Of Data Signals, A Number Of Activated Parallel Driver Cells Of A Second Set To Source The Delayed Data Signal 606

Provide Control Signals To The Calculated Number Of Activated Parallel Driver Cells In The First Set, The Control Signals Causing, In Each Of The Number Of Activated Parallel Driver Cells, Addressing Logic To Provide To A Multiplexer Of The Parallel Driver Cell One Or More Addressing Signals Causing The Multiplexer To Select As The Multiplexer Output Signal The Complement Data Signal 608

Provide Control Signals To The Calculated Number Of Activated Parallel Driver Cells In The Second Set, The Control Signals Causing, In Each Of The Number Of Activated Parallel Driver Cells In The Second Set, Addressing Logic To Provide To A Multiplexer Of The Parallel Driver Cell One Or More Addressing Signals Causing The Multiplexer To Select As The Multiplexer Output Signal The Delayed Data Signal 610

Receive, By The SST Driver Circuit, One Or More Data Signals At The Data Transmission Signal Inputs 306

Receive A Complement Data Signal 612

Receive A Delayed Data Signal 614

Transmit, Through The Activated Parallel Driver Cells And The SST Driver Circuit Output, An Output Data Signal Responsive To The Received Data Signals 308

FIG. 6

SOURCE SERIES TERMINATED DRIVER CIRCUIT WITH PROGRAMMABLE OUTPUT RESISTANCE, AMPLITUDE REDUCTION, AND EQUALIZATION

BACKGROUND OF THE INVENTION

1. Field of the Invention

The field of the invention is signal processing, or, more specifically, source series terminated ("SST") driver circuits and methods for operating such SST driver circuits.

2. Description of Related Art

Today's computing systems are increasingly more complex. One technology increasing in complexity is data communications bus technology. Data rates, data sizes, and the like are growing. Requirements for drivers that transmit data signals at such data rates and sizes are also becoming more stringent. For example, the Peripheral Component Interconnect (PCI) and PCI express (PCIe) standards include various driver requirements. The PCIe driver is required to have a differential output resistance at 50 ohms with a 20% tolerance. The PCIe Generation 1 and PCIe Generation 2 standards require fixed equalization amounts for 2.5 Gigabits per second (Gbps) and 5 Gbps data rates, respectively. The PCIe Generation 3 standard allows, for a data rate of 8 Gbps, a variable equalization defined in fixed step sizes. Each of the PCIe equalization requirements specify a tolerance of 1-1.5 decibels (db). Further, PCIe standards provide for reduced amplitude modes of operation, and the equalization and output resistance values must be maintained when operating in these modes.

Some driver circuits today attempt to provide for one of these requirements. For example, some driver circuits enable the output resistance to be programmable. These circuits, however, rely on parallel Field Effect Transistor ('FET') arrays in the driver's output stage. The FETs are typically large in order to achieve a small granularity in resistance step size. Using such large FETs, however, greatly increases the output capacitance of the driver circuit.

Many of today's driver circuits do not address equalization reduction due to package loss. Instead, such circuits require a user to adjust equalization coefficients for a particular package loss. This approach, however, is not sufficient for all applications as data rates may change on the fly during data rate negotiation. Adjusting equalization settings for package loss on the fly is difficult for a user.

What is needed, therefore, is a driver circuit that provides variable output resistance, with minimal increase in output capacitance, a driver circuit that provides variable output resistance along with variable equalization settings, a driver circuit that provides variable output resistance along with variable equalization settings and amplitude reduction, and a driver circuit that provides variable output resistance along with variable equalization settings, amplitude reduction, and equalization adjustment due to package loss—all while maintaining the output resistance within a predefined tolerance.

SUMMARY OF THE INVENTION

Source Series Terminated ('SST') driver circuits and methods of operating such circuits are disclosed in this specification. The SST driver circuits include one or more data signal inputs; one or more control signal inputs; a driver output; and a plurality of driver cells. The driver cells are coupled in parallel to one another with outputs of the driver cells coupled together to form the driver output of the SST driver circuit. Output resistance of the SST driver circuit varies in dependence upon activation of one or more of the parallel driver cells, activation of each driver cell controlled by control signals received at the control signal inputs.

Operating such an SST driver circuit includes programming, by an SST driver circuit controller, the SST driver circuit to effect a target output resistance. Programming the SST driver circuit to effect a target output resistance includes providing a predefined set of control signals to the one or more control signal inputs thereby activating a predefined number of the driver cells in accordance with the target output resistance. Operating the SST driver circuit also includes receiving, by the SST driver circuit, one or more data signals at the data transmission signal inputs and transmitting, through the activated parallel driver cells and the SST driver circuit output, an output data signal responsive to the received data signals.

In some embodiments, the SST driver circuit controller also programs the SST driver circuit to effect a target equalization of data signals transmitted by the SST driver circuit, by calculating a number of activated parallel driver cells to source a true or complement, delayed data signal and providing controls signals to the calculated number of activated parallel driver cells to configure the cells to source the true or complement, delayed data signal.

In other embodiments SST driver circuit controller programs the SST driver circuit to effect a target amplitude reduction by calculating a number of activated parallel driver cells to source a complement data signal and providing control signals to the cells to configure the cells to source the complement data signal.

In other embodiments SST driver circuit controller programs the SST driver circuit to effect a target equalization along with a target amplitude reduction by calculating a number of activated parallel driver cells to source a complement data signal and calculating a number of activated parallel driver cells to source a true or complement, delayed data signal, and providing control signals to configure the cells accordingly.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

FIG. 6 sets forth a flow chart illustrating a further exemplary method for operating an SST driver circuit according to embodiments of the present invention, where the SST driver circuit is programmed to effect a target output resistance, a target equalization, and a target amplitude reduction.

DETAILED DESCRIPTION OF EXEMPLARY EMBODIMENTS

Figure 1:
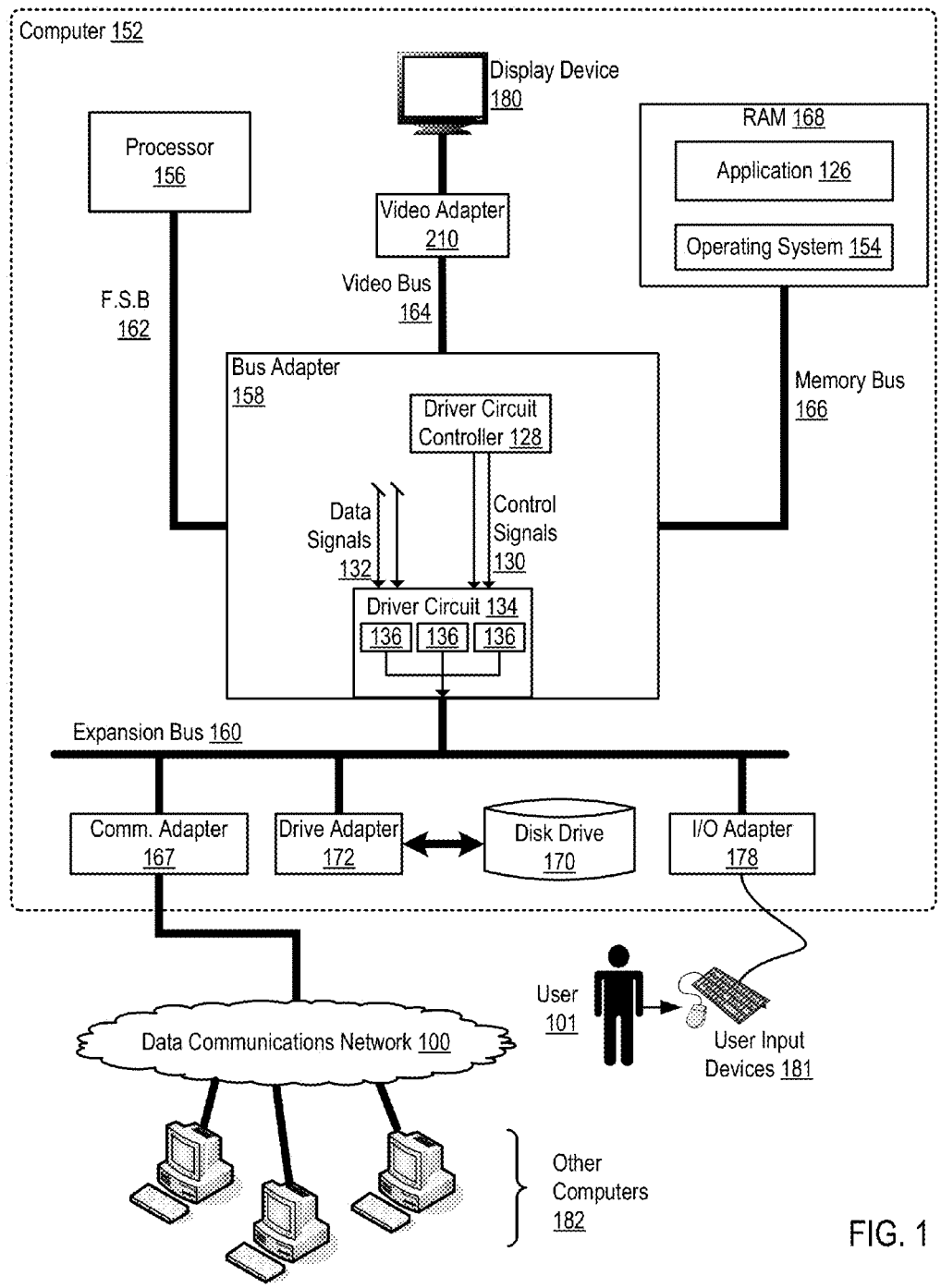
FIG. 1 sets forth a block diagram of a system that includes an SST driver circuit configured and operated in accordance with embodiments of the present invention.

Exemplary SST driver circuits and methods for operating such SST driver circuits in accordance with embodiments of the present invention are described with reference to the accompanying drawings, beginning with FIG. 1. FIG. 1 sets forth a block diagram of a system that includes an SST driver circuit configured and operated in accordance with embodiments of the present invention.

The system of FIG. 1 includes automated computing machinery comprising an exemplary computer (152) that includes an SST driver configured and operated according to embodiments of the present invention. The computer (152) of FIG. 1 includes at least one computer processor (156) or 'CPU' as well as random access memory (168) ('RAM') which is connected through a high speed memory bus (166) and bus adapter (158) to processor (156) and to other components of the computer (152).

The bus adapter (158) in the example of FIG. 1 includes an SST driver circuit (134) configured and operated in accordance with embodiments of the present invention. A driver circuit that is "source-series terminated" refers to a circuit in which a terminating resister is located physically closer to the signal source (rather than the signal destination) and in series with the transmission line (rather than in parallel).

The SST driver circuit (134) in the example of FIG. 1 includes one or more data signal (132) inputs, one or more control (130) inputs and a driver output. The data signals (132) may be provided by any components in the computing system such as the processor (156), the video adapter (210), RAM (168), the communications adapter (167), the disk drive adapter (172), and the I/O adapter (178).

The example SST driver circuit (134) also includes a plurality of driver cells. An individual driver cell is described below in greater detail with respect to FIG. 2. In this example, the driver cells (136) are coupled in parallel to one another. The outputs of the driver cells (136) are coupled together to form the driver output of the SST driver circuit (134). The output resistance of the SST driver circuit (134) varies in dependence upon activation of one or more of the parallel driver cells (136). Activation of each driver cell (136) is controlled by control signals (130) received at the control signal inputs.

In the example of FIG. 1, an SST driver circuit controller (128) provides the control signals (130) to the driver circuit (134). The SST driver circuit controller (128) is configured to operate the SST driver circuit (134) in accordance with embodiments of the present invention by programming the SST driver circuit to effect a target output resistance. The target output resistance may be provided by a user, established during a power-on self test ('POST') operation by a Basic Input/Output System (BIOS) module, set by the manufacturer of the bus adapter (158) at manufacture time, or in other ways as will occur to readers of skill in the art. The SST driver circuit controller (128) may program the SST driver circuit to effect a target output resistance by providing a predefined set of control signals (130) to the one or more control signal inputs thereby activating a predefined number of the driver cells in accordance with the target output resistance. That is, the SST driver circuit controller is configured with a various predefined sets of control signals that are each associated with a different target output resistance. In some embodiments, these predefined sets of control signals may be determined through a series of tests or calculated prior to configuring the SST driver circuit controller (128) to control operation of the SST driver circuit (134).

Once configured, the SST driver circuit receives one or more data signals (132) at the data transmission signal inputs and transmits, through the activated parallel driver cells (136) and the SST driver circuit output, an output data signal responsive to the received data signals. That is, the SST driver circuit transmits an output data signal with the target output resistance.

The SST driver circuit controller (128) may also be configured to program the driver circuit to effect any combination of: a target equalization or amplitude reduction, along with the target output resistance. Such operation and configuration is described below in greater detail.

The SST driver circuit controller (128) may be implemented in a variety of ways: as an application specific integrated circuit ('ASIC'), as a system-on-chip ('SOC'), as a field programmable gate array ('FPGA'), as a computer processor, as a microcontroller, as an aggregation of digital and analog logic and the like. The SST driver circuit (134) may also be implemented with additional analog and digital logic, processors, microcontrollers, FPGAs, ASICs, and other electrical components as will occur to readers of skill. One example implementation of an SST driver circuit (134) configured in accordance with embodiments of the present invention is a PCI or PCIe driver circuit.

Continuing with the other portions of the system of FIG. 1: stored in RAM (168) is a application (126), a module of computer program instructions that carries out user-level data processing tasks. Examples of such applications include word processing applications, spreadsheet applications, database management applications, multimedia library management applications, multimedia presentation applications, and the like. Also stored in RAM (168) is an operating system (154). Operating systems useful in computers that include SST driver circuits configured and operated according to embodiments of the present invention include UNIX™, Linux™, Microsoft XP™, AIX™, IBM's i5/OS™, and others as will occur to those of skill in the art. The operating system (154) and application (126) in the example of FIG. 1 are shown in RAM (168), but many components of such software typically are stored in non-volatile memory also, such as, for example, on a disk drive (170).

The computer (152) of FIG. 1 includes disk drive adapter (172) coupled through expansion bus (160) and bus adapter (158) to processor (156) and other components of the computer (152). Disk drive adapter (172) connects non-volatile data storage to the computer (152) in the form of disk drive (170). Disk drive adapters useful in computers that include SST driver circuits configured and operated according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computer (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computer (152) of FIG. 1 includes a communications adapter (167) for data communications with other computers (182) and for data communications with a data communications network (100). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers that include SST driver circuits configured and operated according to embodiments of the present invention include modems for wired dial-up communications, Ethernet (IEEE 802.3) adapters for wired data communications, and 802.11 adapters for wireless data communications.

The arrangement of computing components, computers, networks, driver control circuits, driver circuits, and other devices making up the exemplary system illustrated in FIG. 1 are for explanation, not for limitation. Data processing systems useful according to various embodiments of the present invention may include additional servers, routers, other devices, and peer-to-peer architectures, not shown in FIG. 1, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 1.

As mentioned above, the SST driver circuit (134) of FIG. 1 includes a plurality of parallel driver cells (136). For further explanation, therefore, FIG. 2 includes a circuit diagram of one driver cell (136) of an SST driver circuit (134) configured and operated in accordance with embodiments of the present invention.

Figure 2:
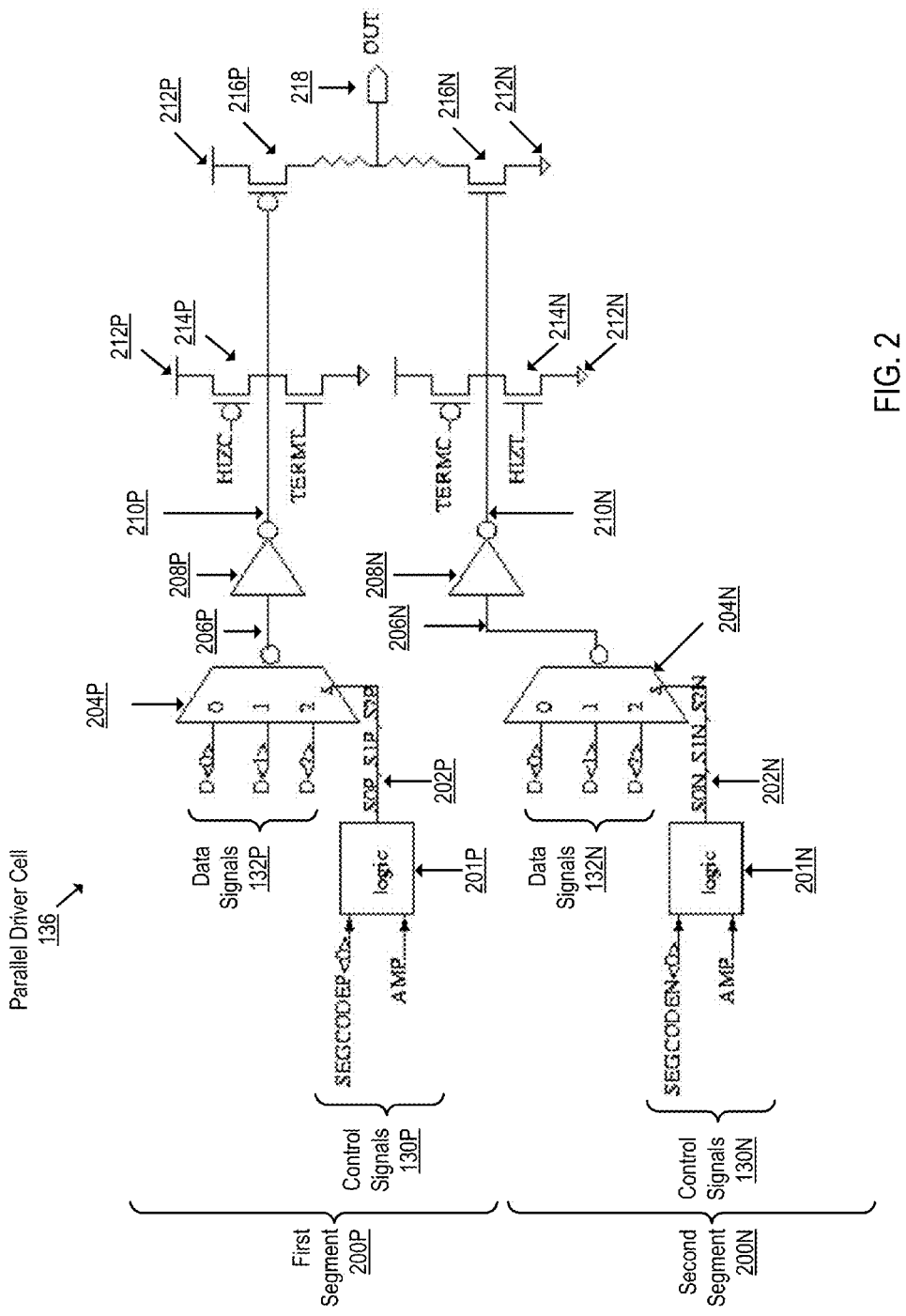
FIG. 2 includes a circuit diagram of one driver cell of an SST driver circuit configured and operated in accordance with embodiments of the present invention.

The example driver cell (136) of FIG. 2 includes a first segment (200P) and a second segment (200N). Each segment includes an activation Field Effect Transistor ('FET') (214P, 214N) controlling activation of the segment in the driver cell responsive to a control input signal (HIZC, HIZT).

Each segment (200P, 200N) of the example driver cell (136) of FIG. 2 also includes addressing logic (201P, 201N). The addressing logic (201P, 201N) is configured to receive one or more control input signals (130P, 130N) from control signal inputs and output one or more addressing signals (202P, 202N) responsive to the control input signals (130P, 130N). Although the addressing logic in the example of FIG. 2 is depicted as part of an individual driver cell, readers of skill in the art will recognize that such logic may be implemented in a variety of fashions, separate from a driver cell.

Each segment (200P, 200N) of the example parallel driver cell (136) of FIG. 2 also includes a multiplexer (204P, 204N). The multiplexer (204P, 204N) is coupled to the addressing logic (201P, 201N) to receive the addressing signals (202P, 202N). The multiplexer (204P, 204N) is configured to receive a plurality of data signals (132P, 132N) from the data signal inputs of the SST driver circuit and to select among the data signals (132P, 132N) in dependence upon the addressing signals (202P, 202N). The multiplexer (204P, 204N) is also configured to provide a multiplexer output signal (206P, 206N).

Each segment (200P, 200N) of the example parallel driver cell (136) of FIG. 2 also includes a segment driver (208P, 208N). The segment driver (208P, 208N) is configured to receive the multiplexer output signal (206P, 206N) and provide a driver output signal (210P, 210*n*).

Each segment (200P, 200N) of the example parallel driver cell (136) of FIG. 2 also includes an output FET (216P, 216N). In the example of FIG. 2, each output FET is coupled through a resistor to an output (218) of the driver cell. The output (218) of the driver cell is coupled to the outputs of all other driver cells, where the parallel connection of all outputs of all driver cells forms the output the of SST driver circuit.

In the example of FIG. 2, the activation FET (214P) of the first segment is implemented as a p-type FET ('PFET') and the activation FET (214N) of the second segment is an n-type FET ('NFET').

The output FET (216P) of the first segment is implemented as a PFET configured to couple a voltage source (212P) to an output (218) of the driver cell when activated. The output FET (212P) of the first segment coupled to the segment driver (208P) output to receive the segment driver signal (210P) of the first segment (200P). The segment driver signal (210P) of the first segment controls activation of the output FET (216P) of the first segment (200P).

The output FET (216N) of the second segment is implemented as an NFET configured to couple the output (218) of the driver cell (136) to a ground voltage (212N) when activated. The output FET (216N) of the second segment (200N) is coupled to the segment driver (208N) output to receive the segment driver signal (210N) of the second segment (200N). The segment driver signal (210N) of the second segment (200N) controls activation of the output FET (216N) of the second segment.

To effect a target output resistance in the SST driver circuit, this example driver cell (136) may, along with other driver cells in the SST driver circuit, be activated through use of the high resistance FETs (212P, 212N). To effect a target equalization of data signals, this example driver cell (136) may, along with other driver cells in the SST driver circuit, be configured to source a true or complement, delayed data signal (132P, 132N) by setting the multiplexers (204P, 204N) to select the delayed data signal as the multiplexer output signal (206P, 206N). To effect a target amplitude reduction of data signals, this example driver cell (136) may, along with other driver cells in the SST driver circuit, be configured to source a complement data signal (132P, 132N) by setting the multiplexers (204P, 204N) to select the complement data signal as the multiplexer output signal (206P, 206N).

Figure 3:
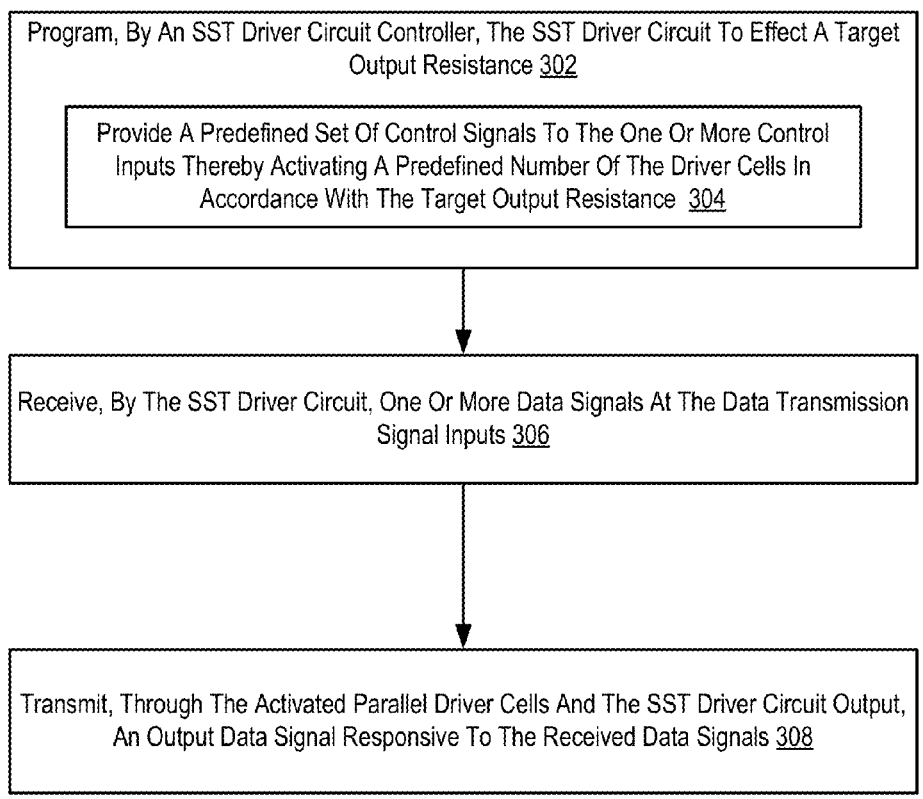
FIG. 3 sets forth a flow chart illustrating an exemplary method for operating an SST driver circuit according to embodiments of the present invention, where the SST driver circuit is programmed to effect a target output resistance.

For further explanation, FIG. 3 sets forth a flow chart illustrating an exemplary method for operating an SST driver circuit according to embodiments of the present invention, where the SST driver circuit is programmed to effect a target output resistance. The SST driver circuit operated in accordance with the method of FIG. 3 may be similar to that in the example of FIG. 1 that includes one or more data signal (132) inputs, one or more control signal (130) inputs, a driver output, and a plurality of driver cells (136). The driver cells (136) are coupled in parallel to one another and outputs of the driver cells are coupled together to form the driver output of the SST driver circuit (134). The output resistance of the SST driver circuit varies in dependence upon activation of one or more of the parallel driver cells (136) and activation of each driver cell is controlled by control signals (130) received at the control signal inputs.

The method of FIG. 3 includes programming (302), by an SST driver circuit controller, the SST driver circuit to effect a target output resistance. In the example of FIG. 3, programming (302) the SST driver circuit to effect a target output resistance is carried out by providing a predefined set of control signals to the one or more control signal inputs thereby activating a predefined number of the driver cells in accordance with the target output resistance. The SST driver circuit controller may be pre-configured with a set of predefined control signals to send to the SST driver cell depending upon the desired target output impedance. Such control signals may be determined through testing, simulation, calculation, and in other ways as will occur to readers of skill in the art.

The method of FIG. 3 also includes receiving (306), by the SST driver circuit, one or more data signals at the data transmission signal inputs and transmitting (308), through the activated parallel driver cells and the SST driver circuit output, an output data signal responsive to the received data signals. The data signals received may be one more source signals to be transmitted through the driver circuit to a destination component. Once the parallel driver cells in the example of FIG. 3 are activated to effect a target output resistance, one or more data signals are received by the SST driver, passed through the active parallel driver cells, and out the single output to the destination component, with the desired target output resistance set.

Figure 4:
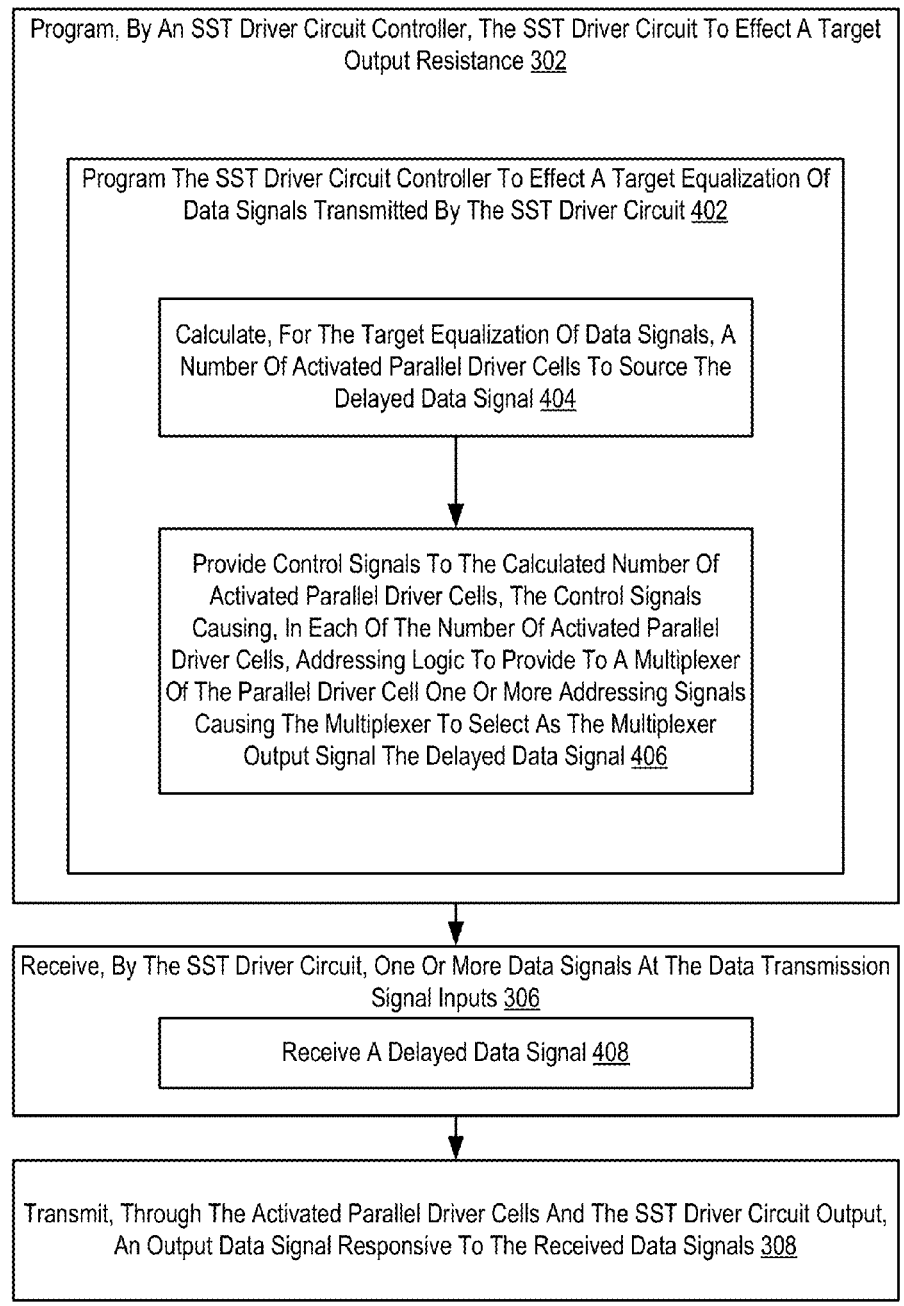
FIG. 4 sets forth a flow chart illustrating a further exemplary method for operating an SST driver circuit according to embodiments of the present invention, where the SST driver circuit is programmed to effect a target output resistance and a target equalization.

For further explanation, FIG. 4 sets forth a flow chart illustrating a further exemplary method for operating an SST driver circuit according to embodiments of the present invention, where the SST driver circuit is programmed to effect a target output resistance and a target equalization. In the method of FIG. 4, the SST driver circuit may be configured similar to the driver circuit of FIG. 1 (as described above) and with each of the parallel driver cells configured in a manner similar to that depicted in the example of FIG. 2. For example, each parallel driver cell (136) of FIG. 4 includes a first segment (200P) and a second segment (200N). Each segment includes an activation Field Effect Transistor ('FET') (214P, 214N) controlling activation of the segment in the driver cell responsive to a control input signal (HIZC, HIZT). Each segment (200P, 200N) of the example driver cell (136) also includes addressing logic (201P, 201N). The addressing logic (201P, 201N) is configured to receive one or more control input signals (130P, 130N) from control signal inputs and output one or more addressing signals (202P, 202N) responsive to the control input signals (130P, 130N).

Each segment (200P, 200N) of the example parallel driver cell (136) also includes a multiplexer (204P, 204N). The multiplexer (204P, 204N) is coupled to the addressing logic (201P, 201N) to receive the addressing signals (202P, 202N). The multiplexer (204P, 204N) is configured to receive a plurality of data signals (132P, 132N) from the data signal inputs of the SST driver circuit and to select among the data signals (132P, 132N) in dependence upon the addressing signals (202P, 202N). The multiplexer (204P, 204N) is also configured to provide a multiplexer output signal (206P, 206N).

Each segment (200P, 200N) of the example parallel driver cell (136) also includes a segment driver (208P, 208N). The segment driver (208P, 208N) is configured to receive the multiplexer output signal (206P, 206N) and provide a driver output signal (210P, 210n). Each segment (200P, 200N) of the example parallel driver cell (136) also includes an output FET (216P, 216N). Each output FET is coupled through a resistor to an output (218) of the driver cell. The output (218) of the driver cell is coupled to the outputs of all other driver cells, whether the combination of all outputs of all driver cells forms the output the of SST driver circuit.

The activation FET (214P) of the first segment is implemented as a p-type FET ('PFET') and the activation FET (214N) of the second segment is an n-type FET ('NFET'). The output FET (216P) of the first segment is implemented as a PFET configured to couple a voltage source (212P) to an output (218) of the driver cell when activated. The output FET (212P) of the first segment coupled to the segment driver (208P) output to receive the segment driver signal (210P) of the first segment (200P). The segment driver signal (210P) of the first segment controls activation of the output FET (216P) of the first segment (200P). The output FET (216N) of the second segment is implemented as an NFET configured to couple the output (218) of the driver cell (136) to a ground voltage (212N) when activated. The output FET (216N) of the second segment (200N) is coupled to the segment driver (208N) output to receive the segment driver signal (210N) of the second segment (200N). The segment driver signal (210N) of the second segment (200N) controls activation of the output FET (216N) of the second segment.

The method of FIG. 4 is also similar to the method of FIG. 3, including as it does programming (302) the SST driver circuit to effect a target output resistance, receiving (306) one or more data signals at the data transmission signal inputs, and transmitting (308), through the activated parallel driver cells and the SST driver circuit output, an output data signal responsive to the received data signals.

The method of FIG. 4 differs from the method of FIG. 3, however, in that in the method of FIG. 4, receiving (306) one or more data signals at the data transmission signal inputs includes receiving a true or complement, delayed delayed data signal and programming (302) the SST driver circuit to effect a target output resistance also includes programming (402) the SST driver circuit controller to effect a target equalization of data signals transmitted by the SST driver circuit. In the method of FIG. 4, programming (402) the SST driver circuit controller to effect a target equalization of data signals transmitted by the SST driver circuit is carried out by calculating (404), for the target equalization of data signals, a number of activated parallel driver cells to source the delayed data signal and providing (406) control signals to the calculated number of activated parallel driver cells. The control signals cause, in each of the number of activated parallel driver cells, the addressing logic (201P, 201N) to provide to a multiplexer (204P, 204N) of the parallel driver cell one or more addressing signals (202P, 202N) that cause the multiplexer (204P, 204N) to select as the multiplexer output signal (206P, 206N) the delayed data signal (132P, 132N).

In the method of FIG. 4, calculating (404), for the target equalization of data signals, a number of activated parallel driver cells to source the delayed data signal may be carried out by calculating the number of activated parallel driver cells in accordance with:

$$M = \text{round}\left(\frac{EQ\text{targ}}{EQ\_Step}\right),$$

where EQ_Step=1/N, N is the total number of activated parallel driver cells, EQtarg is the target equalization, and M is the calculated number of activated parallel driver cells to source the complement delayed data signal.

In embodiments that take into account bandwidth loss (or data transmission package loss), calculating (404), for the target equalization of data signals, a number of activated parallel driver cells to source the delayed data signal may be carried out by calculating the number of activated parallel driver cells in accordance with:

$$M' = M * BW\text{coeff},$$

where $$BW\text{coeff} = \frac{1}{1 - BW\text{loss}},$$

and BWloss is a user provided value representing real-time bandwidth loss.

Figure 5:
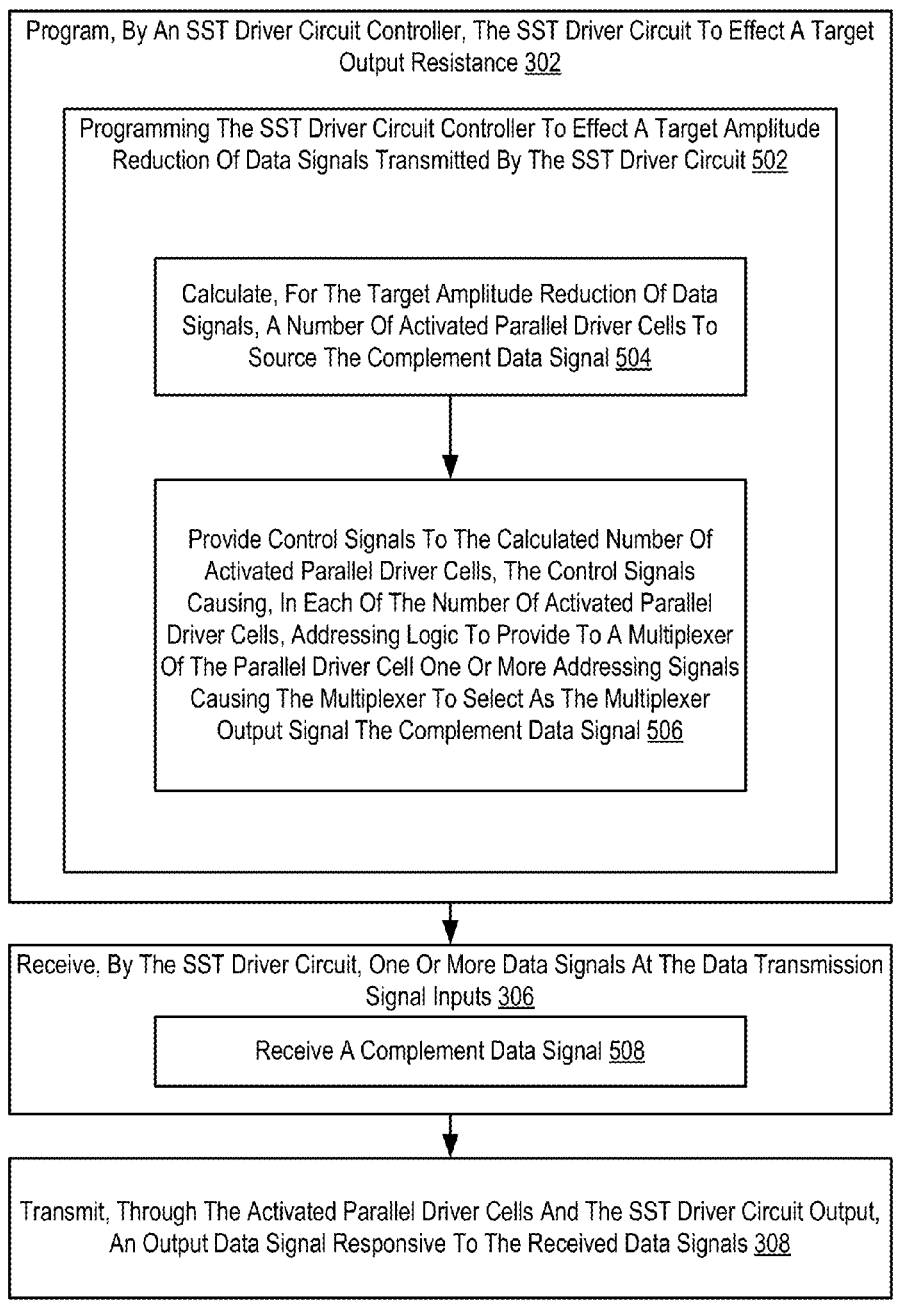
FIG. 5 sets forth a flow chart illustrating a further exemplary method for operating an SST driver circuit according to embodiments of the present invention, where the SST driver circuit is programmed to effect a target output resistance and a target amplitude reduction.

For further explanation, FIG. 5 sets forth a flow chart illustrating a further exemplary method for operating an SST driver circuit according to embodiments of the present invention, where the SST driver circuit is programmed to effect a target output resistance and a target amplitude reduction. The SST driver circuit operated in accordance with the method of FIG. 5 may be configured in a manner similar the SST driver circuit (134) of FIG. 1 with parallel driver cells configured in the manner of the parallel driver cell (136) depicted in the example of FIG. 2. For clarity, elements from these figures are utilized in this description of FIG. 5.

The method of FIG. 5 is similar to the method of FIG. 3, including as it does programming (302) the SST driver circuit to effect a target output resistance, receiving (306) one or more data signals at the data transmission signal inputs, and transmitting (308), through the activated parallel driver cells and the SST driver circuit output, an output data signal responsive to the received data signals.

The method of FIG. 5 differs from the method of FIG. 3, however, in that in the method of FIG. 5 receiving (306) one or more data signals at the data transmission signal inputs includes receiving (508) a complement data signal and programming (302) the SST driver circuit to effect a target output resistance also includes programming (502) the SST driver circuit controller to effect a target amplitude reduction of data signals transmitted by the SST driver circuit.

In the method of FIG. 5, programming (502) the SST driver circuit controller to effect a target amplitude reduction of data signals transmitted by the SST driver circuit is carried out by calculating (504), for the target amplitude reduction of data signals, a number of activated parallel driver cells to source the complement data signal and providing (506) control signals to the calculated number of activated parallel driver cells. The control signals cause, in each of the number of activated parallel driver cells, addressing logic (201P, 201N) to provide to a multiplexer (204P, 204N) of the parallel driver cell (135) one or more addressing signals (202P, 202N) that cause the multiplexer (204P, 204N) to select as the multiplexer output signal (206P, 206N) the complement data signal (132P, 132N).

In the method of FIG. 5, calculating (504), for the target amplitude reduction of data signals, a number of activated parallel driver cells to source the complement data signal may be carried out by calculating the number of activated parallel driver cells to source the complement data signal in accordance with:

$$Q = \text{round}(AMP\text{targ} * N),$$

where N is the total number of activated parallel driver cells, AMPtarg is the target amplitude reduction, and Q is the calculated number of activated parallel driver cells to source the complement data signal.

For further explanation, FIG. 6 sets forth a flow chart illustrating a further exemplary method for operating an SST driver circuit according to embodiments of the present invention, where the SST driver circuit is programmed to effect a target output resistance, a target equalization, and a target amplitude reduction. The SST driver circuit operated in accordance with the method of FIG. 6 may be configured in a manner similar the SST driver circuit (134) of FIG. 1 with parallel driver cells configured in the manner of the parallel driver cell (136) depicted in the example of FIG. 2. For clarity, elements from these figures are utilized in this description of FIG. 6.

The method of FIG. 6 is similar to the method of FIG. 3, including as it does programming (302) the SST driver circuit to effect a target output resistance, receiving (306) one or more data signals at the data transmission signal inputs, and transmitting (308), through the activated parallel driver cells and the SST driver circuit output, an output data signal responsive to the received data signals.

The method of FIG. 6 differs from the method of FIG. 3 in that in the method of FIG. 6, receiving (306) one or more data signals at the data transmission signal inputs includes receiving (612) a complement data signal and receiving (614) a true or complement, delayed data signal.

Programming (302) the SST driver circuit to effect a target output resistance also includes programming (602) the SST driver circuit controller to effect a target amplitude reduction and a target equalization of data signals transmitted by the SST driver circuit. In the method of FIG. 6, programming (602) the SST driver circuit controller to effect a target amplitude reduction and a target equalization of data signals transmitted by the SST driver circuit includes calculating (604), for the target amplitude reduction of data signals, a number of activated parallel driver cells of a first set to source the complement data signal and calculating (606), for the target equalization of data signals, a number of activated parallel driver cells of a second set to source the delayed data signal.

In the method of FIG. 6, calculating (604) a number of activated parallel driver cells of a first set to source the complement data signal and calculating (606) a number of activated parallel driver cells of a second set to source the delayed data signal may be carried out by calculating the number of activated parallel driver cells of the first and second set in accordance with:

$$R \approx \text{round}(M(1-Q)),$$

where:
R is the calculated number of activated parallel cells to source the delayed data signal;

$$M = \text{round}\left(\frac{EQ\text{targ}}{EQ\_Step}\right),$$

where EQ_Step=1/N, N is the total number of activated parallel driver cells, and EQtarg comprises the target equalization; and $$Q = \text{round}(AMP\text{targ} * N),$$

AMPtarg comprises the target amplitude reduction.

In embodiments that take into account bandwidth loss (or data transmission package loss), calculating the number of activated parallel driver cells of the first and second set is further carried out in accordance with:

$$R' = R * BWcoeff,$$

where $$BWcoeff = \frac{1}{1 - BWloss},$$

and BWloss is a user provided value representing real-time bandwidth loss.

Programming (602) the SST driver circuit controller to effect a target amplitude reduction and a target equalization of data signals transmitted by the SST driver circuit also includes providing (608) control signals to the calculated number of activated parallel driver cells in the first set. The control signals causing, in each of the number of activated parallel driver cells (136), addressing logic (201P, 201N) to provide to a multiplexer (204P, 204N) of the parallel driver cell (136) one or more addressing signals (202P, 202N) causing the multiplexer (204P, 204N) to select as the multiplexer output signal (206P, 206N) the complement data signal (132P, 132N).

Programming (602) the SST driver circuit controller to effect a target amplitude reduction and a target equalization of data signals transmitted by the SST driver circuit also includes providing (610) control signals to the calculated number of activated parallel driver cells in the second set. The control signals cause, in each of the number of activated parallel driver cells (136) in the second set, addressing logic (201P, 201N) to provide to a multiplexer (204P, 204N) of the parallel driver cell (136) one or more addressing signals (202P, 202N) causing the multiplexer to select as the multiplexer output signal (206P, 206N) the delayed data signal.

In view of the explanations set forth above, readers will recognize that the benefits of SST driver circuits configured according to embodiments of the present invention and methods of operating such SST driver circuits include:

Programmable driver output resistance that meets tolerance requirements of data transmission standards, such as the PCI and PCIe standards;

Programmable driver output resistance along with equalization and/or amplitude reduction, where each setting meets tolerance requirements of data transmission standards, such as the PCI and PCIe standards;

Programmable driver output resistance, equalization and/or amplitude reduction, and on-the-fly bandwidth loss adjustments while each setting maintains the tolerance requirements of data transmission standards, such as the PCI and PCIe standards; and Other benefits as will occur to readers of skill in the art.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of operating a source-series terminated ('SST') driver circuit, the SST driver circuit comprising one or more data signal inputs, one or more control signal inputs, a driver output, and a plurality of driver cells, the driver cells coupled in parallel to one another, outputs of the driver cells coupled together to form the driver output of the SST driver circuit, wherein output resistance of the SST driver circuit varies in dependence upon activation of one or more of the parallel driver cells, each driver cell includes a first segment and a second segment, each segment comprising a multiplexer; activation of each driver cell controlled by control signals received at the control signal inputs, the method comprising:

programming, by an SST driver circuit controller, the SST driver circuit to effect a target output resistance including providing a predefined set of control signals to the one or more control signal inputs thereby activating a predefined number of the driver cells in accordance with the target output resistance;

receiving, by the SST driver circuit, one or more data signals at the data transmission signal inputs; and transmitting, through the activated parallel driver cells and the SST driver circuit output, an output data signal responsive to the received data signals.

2. The method of claim 1 wherein each segment of each driver cell further comprises:

an activation Field Effect Transistor ('FET') controlling activation of the segment in the driver cell responsive to a control input signal;

addressing logic, the addressing logic configured to receive one or more control input signals from control signal inputs and output one or more addressing signals responsive to the control input signals;

wherein the multiplexer is coupled to the addressing logic to receive the addressing signals, the multiplexer configured to receive a plurality of data signals from the data signal inputs and to select among the data signals in dependence upon the addressing signals, the multiplexer further configured to provide a multiplexer output signal;

a segment driver, the segment driver configured to receive the multiplexer output signal and provide a driver output signal; and an output FET; and wherein:

the activation FET of the first segment comprises a p-type FET ('PFET');

the activation FET of the second segment comprises an n-type FET ('NFET');

the output FET of the first segment comprises a PFET configured to couple a voltage source to an output of the driver cell when activated, the output FET of the first segment coupled to the segment driver output to receive the segment driver signal of the first segment, the segment driver signal of the first segment controlling activation of the output FET of the first segment; and the output FET of the second segment comprises an NFET configured to couple the output of the driver cell to a ground voltage when activated, the output FET of the second segment coupled to the segment driver output to receive the segment driver signal of the second segment, the segment driver signal of the second segment controlling activation of the output FET of the second segment.

3. The method of claim 2 wherein:

receiving one or more data signals at the data transmission signal inputs further comprises receiving a delayed data signal; and programming the SST driver circuit to effect a target output resistance further comprises programming the SST driver circuit controller to effect a target equalization of data signals transmitted by the SST driver circuit, including:

calculating, for the target equalization of data signals, a number of activated parallel driver cells to source the delayed data signal; and providing control signals to the calculated number of activated parallel driver cells, the control signals causing, in each of the number of activated parallel driver cells, addressing logic to provide to a multiplexer of the parallel driver cell one or more addressing signals causing the multiplexer to select as the multiplexer output signal the delayed data signal.

4. The method of claim 3 wherein calculating, for the target equalization of data signals, a number of activated parallel driver cells to source the delayed data signal further comprises calculating the number of activated parallel driver cells in accordance with:

$$M = \text{round}\left(\frac{EQtarg}{EQ\_Step}\right),$$

where EQ_Step=1/N, N is the total number of activated parallel driver cells, EQtarg comprises the target equalization, and M comprises the calculated number of activated parallel driver cells to source the complement delayed data signal.

5. The method of claim 4 wherein calculating, for the target equalization of data signals, a number of activated parallel driver cells to source the delayed data signal further comprises calculating the number of activated parallel driver cells in accordance with:

M'=M*BW coeff, where $$BWcoeff = \frac{1}{1 - BWloss},$$

and BWloss comprises a user provided value representing real-time bandwidth loss.

6. The method of claim 2 wherein:
receiving one or more data signals at the data transmission signal inputs further comprises receiving a complement data signal; and
programming the SST driver circuit to effect a target output resistance further comprises programming the SST driver circuit controller to effect a target amplitude reduction of data signals transmitted by the SST driver circuit, including:
calculating, for the target amplitude reduction of data signals, a number of activated parallel driver cells to source the complement data signal; and
providing control signals to the calculated number of activated parallel driver cells, the control signals causing, in each of the number of activated parallel driver cells, addressing logic to provide to a multiplexer of the parallel driver cell one or more addressing signals causing the multiplexer to select as the multiplexer output signal the complement data signal.

7. The method of claim 6 wherein calculating, for the target amplitude reduction of data signals, a number of activated parallel driver cells to source the complement data signal further comprises calculating the number of activated parallel driver cells to source the complement data signal in accordance with:

Q=round(AMPtarg*N), where N is the total number of activated parallel driver cells, AMPtarg comprises the target amplitude reduction, and Q is the calculated number of activated parallel driver cells to source the complement data signal.

8. The method of claim 2 wherein:
receiving one or more data signals at the data transmission signal inputs further comprises receiving a complement data signal and receiving a delayed data signal; and
programming the SST driver circuit to effect a target output resistance further comprises programming the SST driver circuit controller to effect a target amplitude reduction and a target equalization of data signals transmitted by the SST driver circuit, including:
calculating, for the target amplitude reduction of data signals, a number of activated parallel driver cells of a first set to source the complement data signal; and
calculating, for the target equalization of data signals, a number of activated parallel driver cells of a second set to source the delayed data signal; and
providing control signals to the calculated number of activated parallel driver cells in the first set, the control signals causing, in each of the number of activated parallel driver cells, addressing logic to provide to a multiplexer of the parallel driver cell one or more addressing signals causing the multiplexer to select as the multiplexer output signal the complement data signal; and
providing control signals to the calculated number of activated parallel driver cells in the second set, the control signals causing, in each of the number of activated parallel driver cells in the second set, addressing logic to provide to a multiplexer of the parallel driver cell one or more addressing signals causing the multiplexer to select as the multiplexer output signal the delayed data signal.

9. The method of claim 8 wherein calculating, for the target amplitude reduction of data signals, a number of activated parallel driver cells of a first set to source the complement data signal and calculating, for the target equalization of data signals, a number of activated parallel driver cells of a second set to source the delayed data signal further comprises calculating the number of activated parallel driver cells of the first and second set in accordance with:

R=round(M(1−Q)), where:
R is the calculated number of activated parallel cells to source the delayed data signal;

$$M = \text{round}\left(\frac{EQtarg}{EQ\_Step}\right),$$

where EQ_Step=1/N, N is the total number of activated parallel driver cells, and EQtarg comprises the target equalization; and Q=round(AMPtarg*N), AMPtarg comprises the target amplitude reduction.

10. The method of claim 9 wherein calculating the number of activated parallel driver cells of the first and second set is further carried out in accordance with:

R'=R*BW coeff, where $$BWcoeff = \frac{1}{1 - BWloss},$$

and BWloss comprises a user provided value representing real-time bandwidth loss.

11. A source-series terminated ('SST') driver circuit, the SST driver circuit comprising:
one or more data signal inputs;
one or more control signal inputs;
a driver output; and
a plurality of driver cells, the driver cells coupled in parallel to one another, outputs of the driver cells coupled together to form the driver output of the SST driver circuit, wherein each driver cell includes a first segment and a second segment, each segment comprising a multiplexer; wherein output resistance of the SST driver circuit varies in dependence upon activation of one or more of the parallel driver cells, activation of each driver cell controlled by control signals received at the control signal inputs.

12. The SST driver circuit of claim 11 wherein each segment of each driver cell further comprises:
   a high-resistance Field Effect Transistor ('FET') controlling activation of the segment in the driver cell responsive to a control input signal;
   addressing logic, the addressing logic configured to receive one or more control input signals from control signal inputs and output one or more addressing signals responsive to the control input signals;
   wherein the multiplexer is coupled to the addressing logic to receive the addressing signals, the multiplexer configured to receive a plurality of data signals from the data signal inputs and to select among the data signals in dependence upon the addressing signals, the multiplexer further configured to provide a multiplexer output signal;
   a segment driver, the segment driver configured to receive the multiplexer output signal and provide a driver output signal; and
   an output FET; and
   wherein:
   the high-resistance FET of the first segment comprises a p-type FET ('PFET');
   the high-resistance FET of the second segment comprises an n-type FET ('NFET');
   the output FET of the first segment comprises a PFET configured to couple a voltage source to an output of the driver cell when activated, the output FET of the first segment coupled to the segment driver output to receive the segment driver signal of the first segment, the segment driver signal of the first segment controlling activation of the output FET of the first segment; and
   the output FET of the second segment comprises an NFET configured to couple the output of the driver cell to a ground voltage when activated, the output FET of the second segment coupled to the segment driver output to receive the segment driver signal of the second segment, the segment driver signal of the second segment controlling activation of the output FET of the second segment.

13. The SST driver circuit of claim 12 wherein a number of activated parallel driver cells sources a delayed data signal to effect a target equalization of data signals transmitted by the SST driver circuit.

14. The SST driver circuit of claim 12 wherein a number of activated parallel driver cells sources a complement data signal to effect a target amplitude reduction of data signals transmitted by the SST driver circuit.

15. The SST driver circuit of claim 12 wherein a first set of activated parallel driver cells sources a complement data signal to effect a target amplitude reduction of data signals transmitted by the SST driver circuit and a second set of activated parallel driver cells sources a delayed data signal to effect a target equalization of data signals transmitted by the SST driver circuit.

* * * * *